United States Patent
Chang et al.

(10) Patent No.: US 8,895,979 B2
(45) Date of Patent: Nov. 25, 2014

(54) VERTICAL THIN-FILM TRANSISTOR STRUCTURE OF DISPLAY PANEL AND METHOD OF FABRICATING THE SAME

(71) Applicant: HannStar Display Corp., New Taipei (TW)

(72) Inventors: Jung-Fang Chang, Tainan (TW); Ming-Chieh Chang, Hsinchu County (TW); Jui-Chi Lai, Kaohsiung (TW)

(73) Assignee: HannStar Display Corp., Wugu Dist, New Taipei (TW)

( * ) Notice: Subject to any disclaimer, the term of this patent is extended or adjusted under 35 U.S.C. 154(b) by 0 days.

(21) Appl. No.: 13/937,227

(22) Filed: Jul. 9, 2013

(65) Prior Publication Data
US 2014/0103307 A1 Apr. 17, 2014

(30) Foreign Application Priority Data

Oct. 16, 2012 (CN) .......................... 2012 1 0392837

(51) Int. Cl.
*H01L 29/66* (2006.01)
*H01L 29/786* (2006.01)
*H01L 29/78* (2006.01)

(52) U.S. Cl.
CPC .... *H01L 29/78642* (2013.01); *H01L 29/66969* (2013.01); *H01L 29/78672* (2013.01); *H01L 29/7827* (2013.01); *H01L 29/78663* (2013.01); *H01L 29/7869* (2013.01); *H01L 29/66666* (2013.01); *H01L 29/6675* (2013.01)
USPC .................. 257/43; 438/82; 257/E51.013

(58) Field of Classification Search
CPC ........................... H01L 27/12; H01L 27/1214
USPC ..................................... 257/40, 43
See application file for complete search history.

(56) References Cited

U.S. PATENT DOCUMENTS

| 5,229,310 A * | 7/1993 | Sivan | 438/156 |
| 6,268,625 B1 * | 7/2001 | Lee | 257/331 |
| 7,629,633 B2 | 12/2009 | Chan | |

* cited by examiner

*Primary Examiner* — Allen Parker
*Assistant Examiner* — Patricia Reddington
(74) *Attorney, Agent, or Firm* — Winston Hsu; Scott Margo

(57) ABSTRACT

A vertical thin-film transistor structure includes a substrate, a source electrode, an insulation layer, a drain electrode, two first channel layers, a gate insulation layer and a gate electrode, which are stacked upward in that order on the substrate. The first channel layers are respectively disposed at two opposite ends of the drain electrode, and extend from the upper surface of the drain electrode to the upper surface of the source electrode respectively. Each of the first channel layers contacts the source electrode and the drain electrode. The gate insulation layer is disposed on the source electrode, the first channel layers and the drain electrode. The gate electrode is disposed on the gate insulation layer and covers the first channel layers. Therefore, the volume of the conventional thin-film transistor structure shrinks, and the ratio of the volume of the conventional thin-film transistor structure to that of a pixel structure decreases.

16 Claims, 19 Drawing Sheets

US 8,895,979 B2

VERTICAL THIN-FILM TRANSISTOR STRUCTURE OF DISPLAY PANEL AND METHOD OF FABRICATING THE SAME

BACKGROUND OF THE INVENTION

1. Field of the Invention

The present invention relates to a method of fabricating a thin-film transistor structure of a display panel and a thin-film transistor structure of a display panel, and more particularly, a method of fabricating a vertical thin-film transistor structure of a display panel and a vertical thin-film transistor structure of a display panel.

2. Description of the Prior Art

A thin-film transistor (TFT), which serves as an active device for driving each pixel structure of a display panel, has been widely applied in active matrix flat display panels, such as active liquid crystal display panels or active organic electroluminescent display panels.

The conventional thin-film transistor structure is based on a bottom gate structure. The bottom gate structure includes a gate disposed on a substrate, a gate insulation layer covering the gate, a semiconductor layer serving as a transistor channel, a source disposed at two ends of the semiconductor layer and a drain disposed at two ends of the semiconductor layer. Therefore, the channel of the conventional thin-film transistor structure is horizontal, limiting the size of the conventional thin-film transistor structure. Moreover, as the volume of a pixel structure shrinks, the ratio of the volume of the conventional thin-film transistor structure to the volume of the pixel structure rises, thereby decreasing the aperture ratio of the pixel structure.

Accordingly, reducing the area of the thin-film transistor structure from a top view is a main objective in the field.

SUMMARY OF THE INVENTION

It is one of the objectives of the present invention to provide a vertical thin-film transistor structure of a display panel and a method of fabricating the same, thereby preventing the volume of the above-mentioned thin-film transistor structure from limiting the aperture ratio of the pixel structure.

To achieve the purposes described above, an embodiment of the disclosure provides a vertical thin-film transistor structure of a display panel. The vertical thin-film transistor structure includes a substrate, a source electrode, an insulation layer, a drain electrode, two first channel layers, a gate insulation layer and a gate electrode. The source electrode is disposed on the substrate. The insulation layer is disposed on the source electrode. The drain electrode is disposed on the insulation layer. The first channel layers are respectively disposed at two opposite ends of the drain electrode. The first channel layers extend from the upper surface of the drain electrode, along two opposite sidewalls of the drain electrode, along two opposite sidewalls of the insulation layer and to the upper surface of the source electrode in sequence respectively. Each of the first channel layers contacts the source electrode and the drain electrode. The gate insulation layer is disposed on the source electrode, the first channel layers and the drain electrode. The gate electrode is disposed on the gate insulation layer and covers the first channel layers.

To achieve the purposes described above, an embodiment of the disclosure provides a method for fabricating a vertical thin-film transistor structure of a display panel. First, a substrate is provided. Then, a source electrode, an insulation layer and a drain electrode are formed on the substrate. The source electrode, the insulation layer and the drain electrode are stacked in that order upward on the substrate. Two first channel layers are respectively formed at two opposite ends of the drain electrode. The first channel layers extend from the upper surface of the drain electrode, along two opposite sidewalls of the drain electrode, along two opposite sidewalls of the insulating layer and to the upper surface of the source electrode in sequence respectively. Each of the first channel layers contacts the source electrode and the drain electrode. A gate insulation layer is formed to cover the source electrode, the first channel layers and the drain electrode. A gate electrode is formed on the gate insulation layer to cover the first channel layers.

In the thin-film transistor structure of the present invention, because the source electrode and the drain electrode are stacked together, and because the first channel layers extend from the upper surface of the drain electrode to the upper surface of the source electrode along the direction perpendicular to the substrate, the ratio of the area of the first channel layers to the area of the substrate from a top view can be effectively reduced. Therefore, the volume of the conventional thin-film transistor structure shrinks, and the ratio of the volume of the conventional thin-film transistor structure to the volume of a pixel structure decreases.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
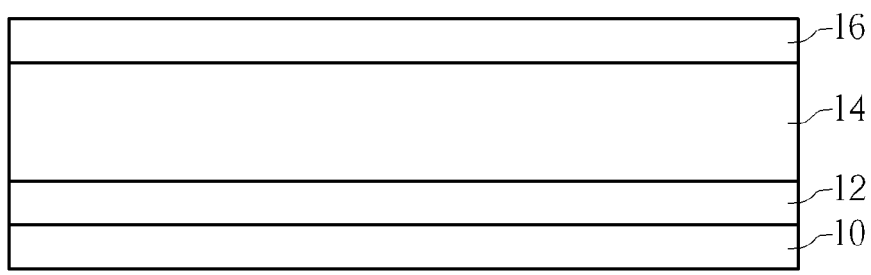
FIGS. 1-14 are schematic diagrams illustrating a method for fabricating a pixel structure of a display panel according to a first embodiment of the present invention.
Figure 2:
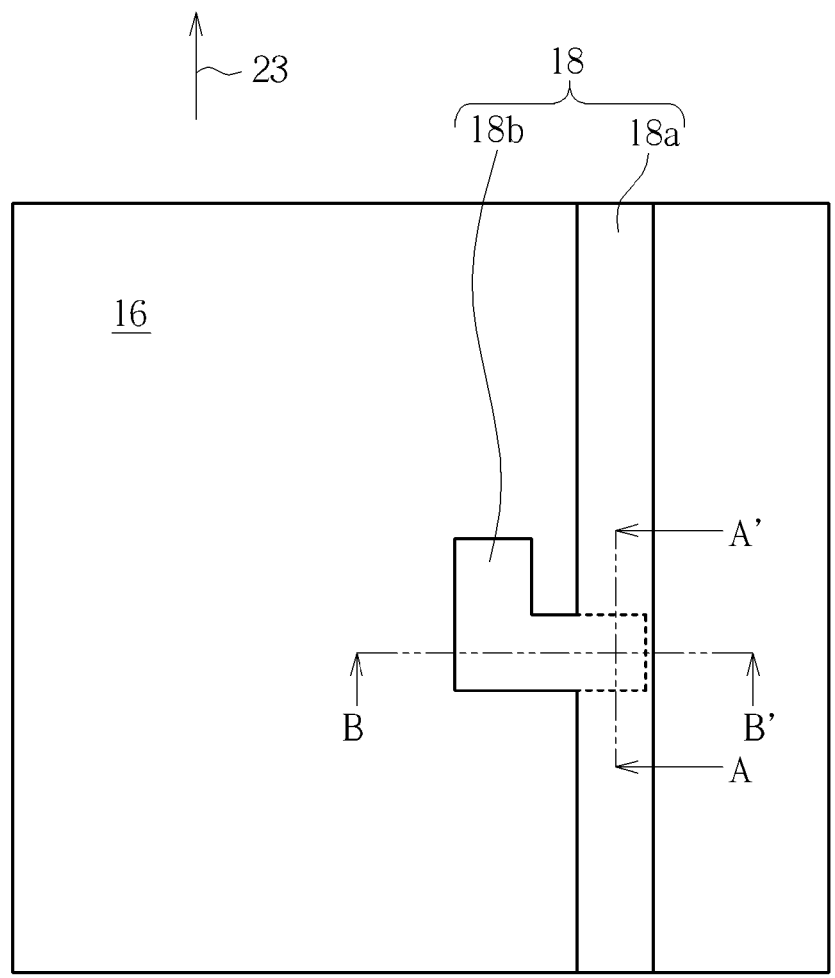
Figure 3:
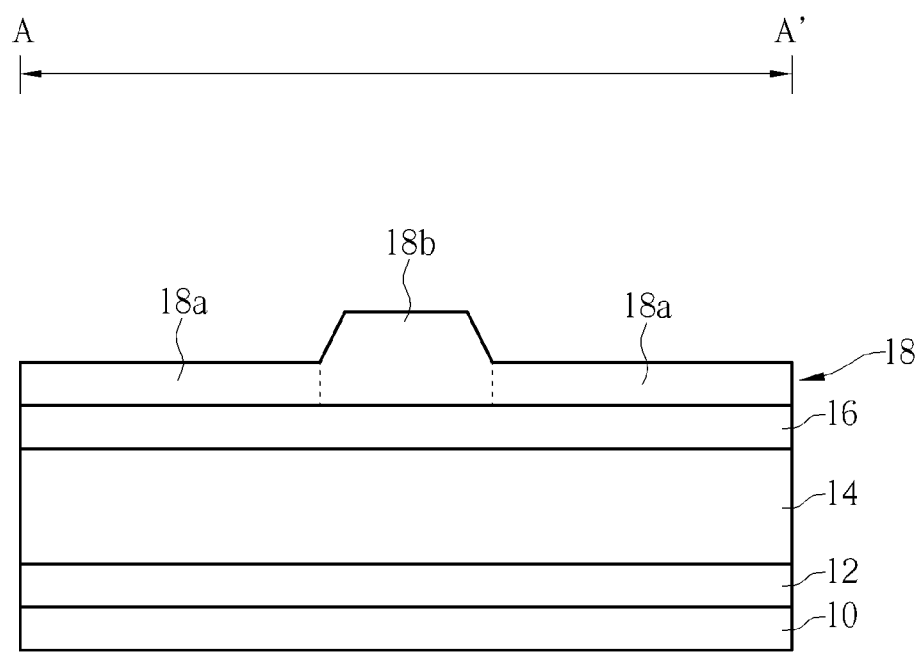
Figure 4:
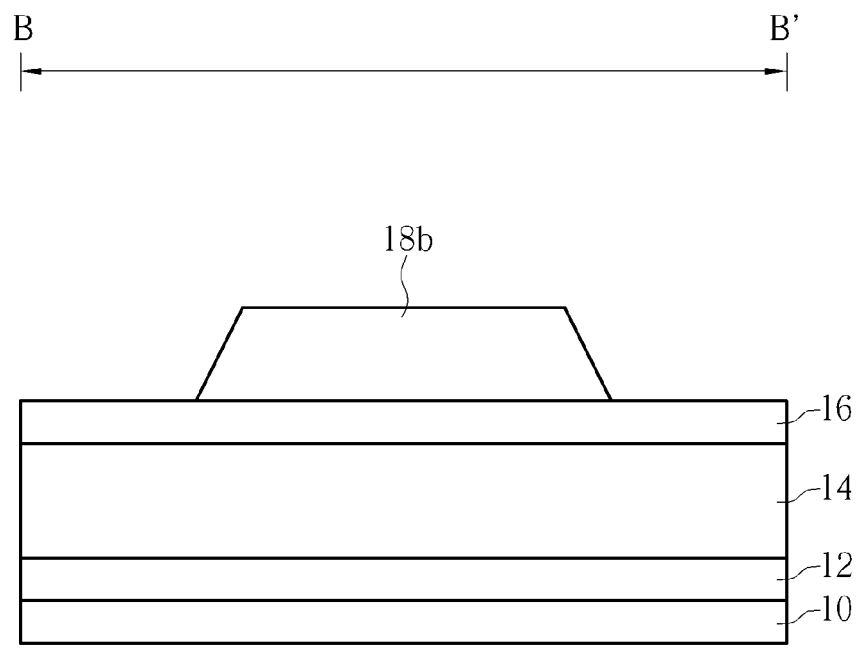
Figure 12:
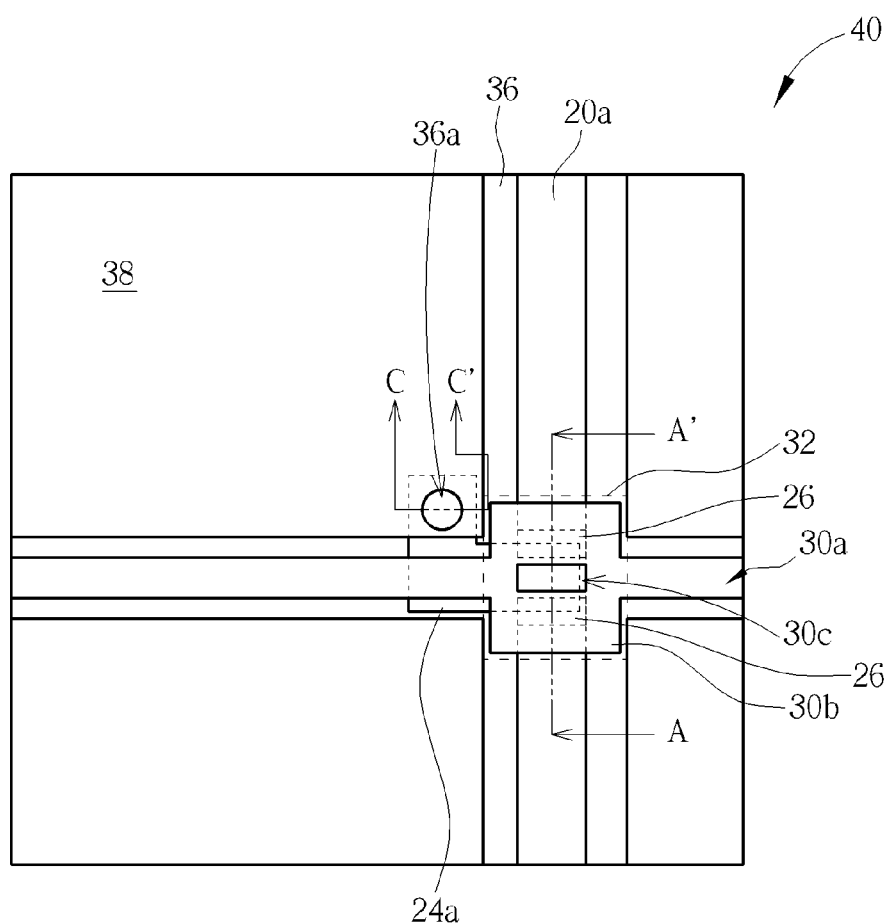
Figure 13:
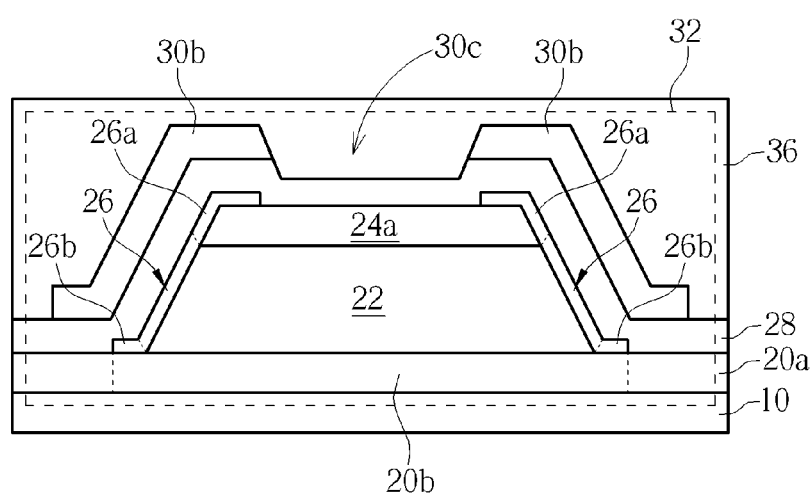
Figure 14:
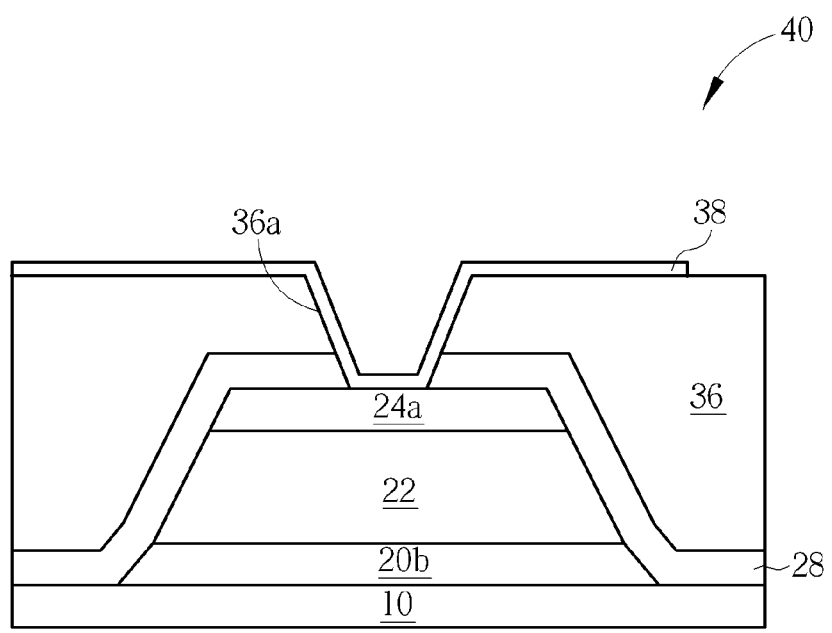

Please refer to FIGS. 1-14. FIGS. 1-14 are schematic diagrams illustrating a method for fabricating a pixel structure of a display panel according to a first embodiment of the present invention. Moreover, FIG. 12 is a top-view schematic diagram illustrating the pixel structure of the display panel according to the first embodiment of the present invention. FIGS. 13-14 are cross-sectional view schematic diagrams illustrating the pixel structure of the display panel according to the first embodiment of the present invention. For brevity purposes, the figures are only for illustration and the figures may not be to scale. The scale may be further modified according to different design considerations. As shown in FIG. 1, a substrate 10, such as a glass substrate 10, a quartz substrate 10 or a plastic substrate 10, is first provided. A first metal layer 12, an insulation material layer 14 and a second metal layer 16 are formed on the substrate 10 in sequence. As shown in FIGS. 2-4, FIG. 3 is a cross-sectional view diagram taken along a cross-sectional line A-A' in FIG. 2. FIG. 4 is a cross-sectional view diagram taken along a cross-sectional line B-B' in FIG. 2. Then, a first photoresist pattern 18 is formed on the second metal layer 16 with a halftone photomask, which serves as a first photomask, and the first photoresist pattern 18 exposes a portion of the second metal layer 16. Moreover, the first photoresist pattern 18 has a first thickness portion 18a and a second thickness portion 18b. The thickness of the first thickness portion 18a is thinner than the thickness of the second thickness portion 18b.

Figure 5:
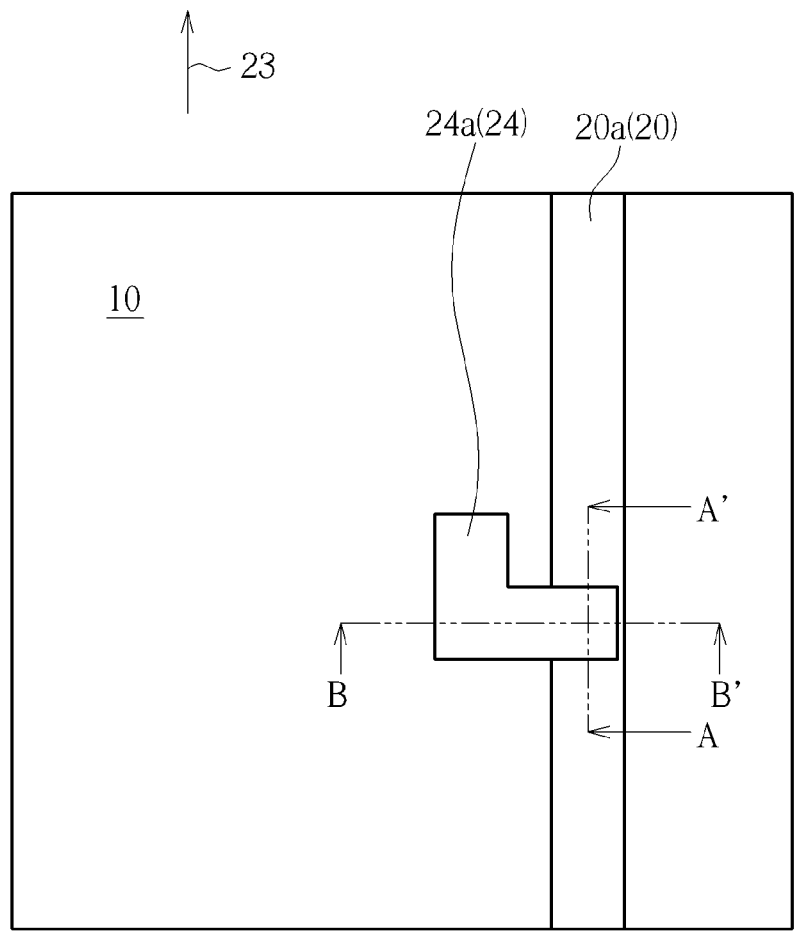
Figure 6:
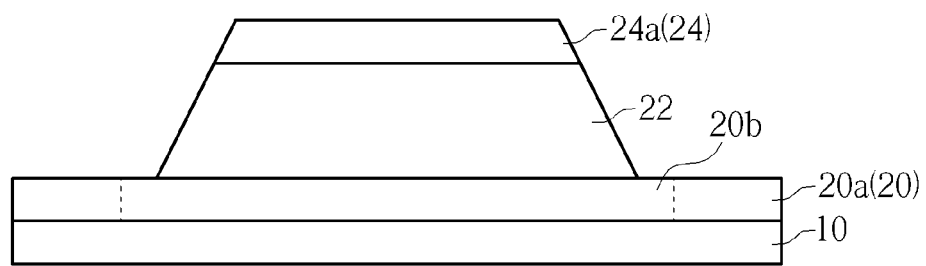
Figure 7:
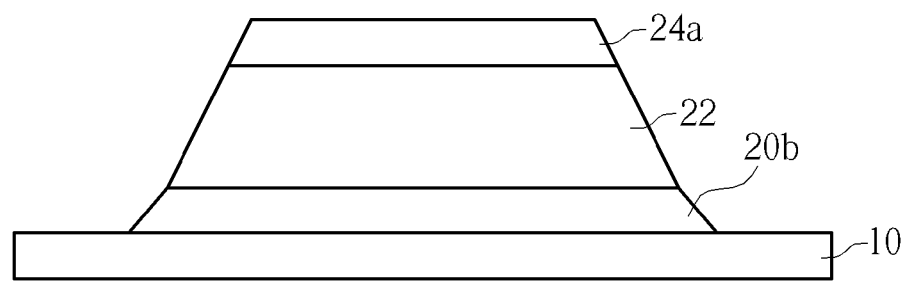

As shown in FIGS. 5-7, FIG. 6 is a cross-sectional view diagram taken along a cross-sectional line A-A' in FIG. 5. FIG. 7 is a cross-sectional view diagram taken along a cross-sectional line B-B' in FIG. 5. An etching process is performed with the first photoresist pattern 18 serving as a mask so as to remove the portion of the second metal layer 16 exposed by the first photoresist pattern 18, a portion of the insulation material layer 14 under the portion of the second metal layer 16 exposed by the first photoresist pattern 18 and a portion of the first metal layer 12 under the portion of the second metal layer 16 exposed by the first photoresist pattern 18. Therefore, a first metal pattern layer 20 is formed from the remaining first metal layer 12. The first metal pattern layer 20 includes a data line 20a disposed along a first direction 23. A portion of the data line 20a serves as a source electrode 20b. The source electrode 20b approximately corresponds to the second thickness portion 18b of the first photoresist pattern 18. The other portion of the data line 20a approximately corresponds to the first thickness portion 18a of the first photoresist pattern 18. Then, another etching process is performed on the first photoresist pattern 18 so as to remove the first thickness portion 18a of the first photoresist pattern 18. The second metal layer 16 under the first thickness portion 18a is therefore exposed, and the second thickness portion 18b also becomes thinner. Another etching process is then performed with the remaining second thickness portion 18b so as to remove the second metal layer 16 corresponding to the first thickness portion 18a and the insulation material layer 14 corresponding to the first thickness portion 18a, thereby exposing a portion of the data line 20a. This time, the remaining second thickness portion 18b serves as a mask. Accordingly, an insulation layer 22 is formed from the remaining insulation material layer 14; a second metal pattern layer 24 is formed from the remaining second metal layer 16. Then, the remaining second thickness portion 18b of the first photoresist pattern 18 is removed. In this embodiment, the second metal pattern layer 24 includes a drain electrode 24a. Because both of the insulation layer 22 and the drain electrode 24a are formed in the same etching process with the second thickness portion 18b serving as a mask, both the insulation layer 22 and the drain electrode 24a have the same pattern from the top view and locate just on the portion of the source electrode 20b corresponding to the second thickness portion 18b. Accordingly, the source electrode 20b, the insulation layer 22 and the drain electrode 24a are stacked sequentially on the substrate 10. The insulation layer 22 is disposed between the drain electrode 24a and the source electrode 20b so as to electrically isolate the drain electrode 24a from the source electrode 20b. Moreover, in the etching process of forming the insulation layer 22 and the drain electrode 24a, because the data line 20a is not damaged, the data line 20a is not completely overlapped by the drain electrode 24a but extends outward just from the bottom of the drain electrode 24a to serve as the source electrode 20b. The methods of fabricating the source electrode 20b, the insulation layer 22 and the drain electrode 24a are not limited to the method with the halftone photomask. In another embodiment of the present invention, a method of fabricating the source electrode, the insulation layer and the drain electrode may include the following steps: First, the data line is formed on the substrate by a photolithography process and an etching process. The insulation material layer and the second metal layer are deposited on the data line and the substrate, and the insulation material layer and the second metal layer are then patterned by another photolithography process and another etching process. Accordingly, the insulation layer and the drain electrode are formed. The present invention, however, is not limited thereto.

Figure 8:
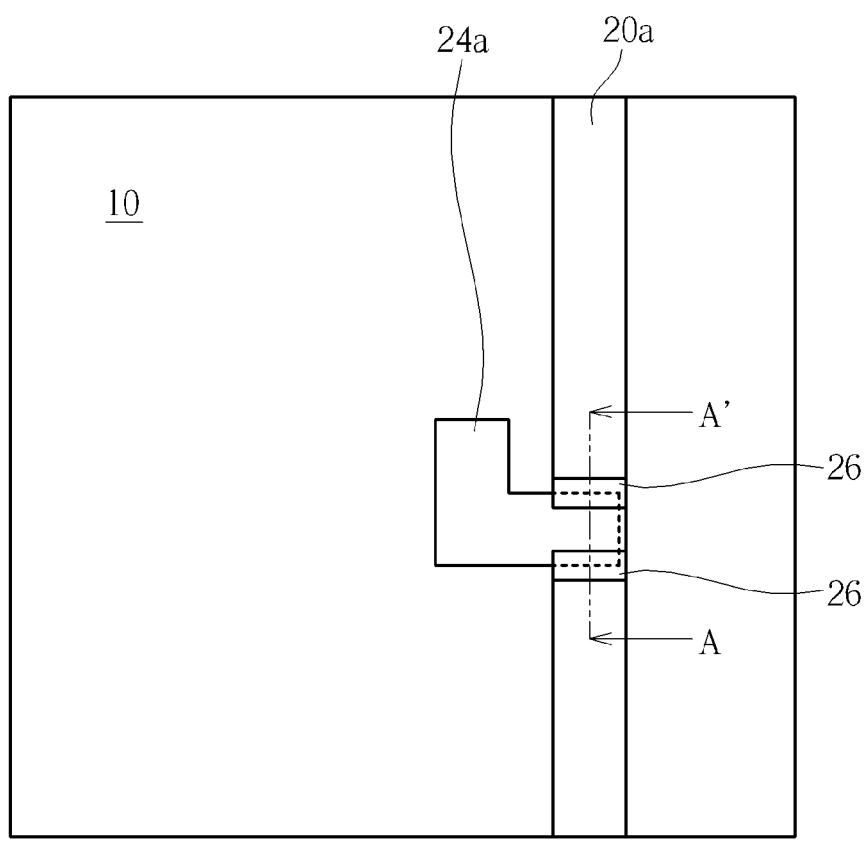
Figure 9:
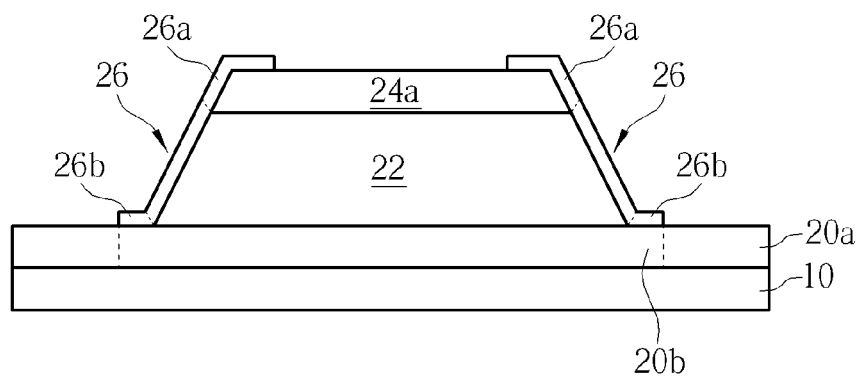

As shown in FIGS. 8-9, FIG. 9 is a cross-sectional view diagram taken along a cross-sectional line A-A' in FIG. 8. A deposition process is carried out so that a channel material layer (not shown) covers the substrate 10. Then, a photolithography process and an etching process are performed to pattern the channel material layer with a second photomask. Therefore, two first channel layers 26 are respectively formed at the two opposite ends of the drain electrode 24a, which lies along the data line 20a. More specifically, the first channel layers 26 extend from the upper surface of the drain electrode 24a, along the two opposite sidewalls of the drain electrode 24a, along the two opposite sidewalls of the insulating layer and to the upper surface of the source electrode 20b in sequence respectively. Each of the first channel layers 26, therefore, contacts both the source electrode 20b and the drain electrode 24a, respectively. In this embodiment, the material of forming channel layers includes metal oxide, such as indium gallium zinc oxide (IGZO), but is not limited thereto. It is worth noting that because a portion of the source electrode 20b extends outward just from the bottom of the drain electrode 24a, each of the first channel layers 26, which is formed after the etching process to form the insulation layer 22 and the source electrode 20b, extends from the upper surface of the drain electrode 24a to the upper surface of the source electrode 20b along the direction almost perpendicular to the substrate 10. Accordingly, vertical channels are formed. Each of the first channel layers 26, moreover, has a lower portion 26b and an upper portion 26a. The upper portion 26a contacts the upper surface of the drain electrode 24a; the lower portion 26b contacts the upper surface of the source electrode 20b. Therefore, the contact area of the upper surface of the drain electrode 24a and each of the first channel layers 26 and the contact area of the upper surface of the source electrode 20b and each of the first channel layers 26 increase, thereby avoiding poor contact between the drain electrode 24a and each of the first channel layers 26 and between the source electrode 20b and each of the first channel layers 26.

Figure 10:
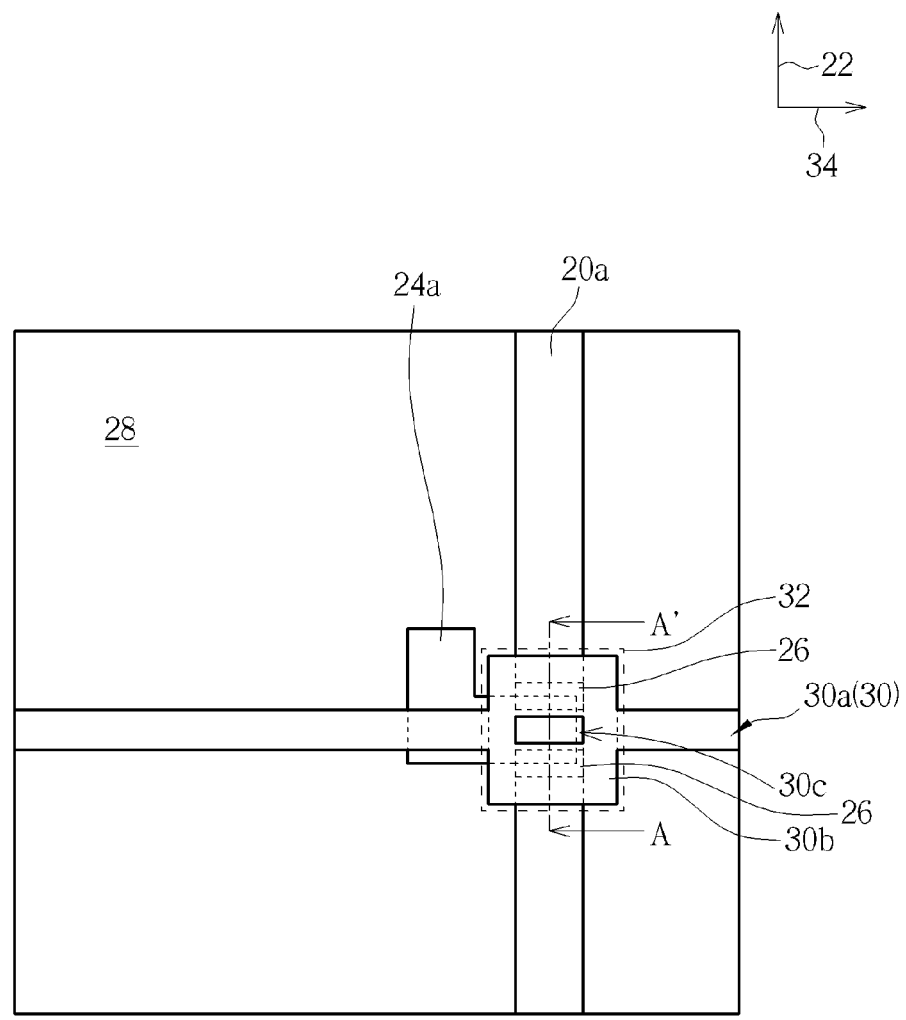
Figure 11:
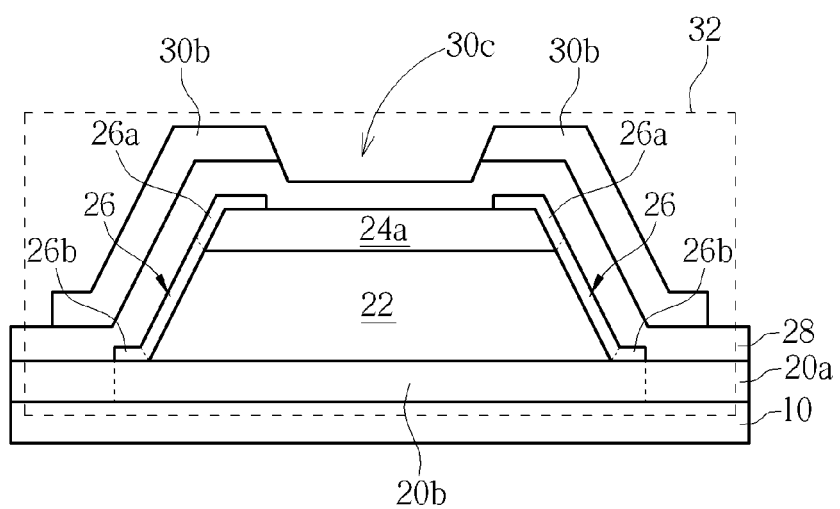

FIG. 11 is a cross-sectional view diagram taken along a cross-sectional line A-A' in FIG. 10. As shown in FIGS. 10-11, a gate insulation layer 28 is formed to cover the substrate 10, the data line 20a, the first channel layers 26 and the drain electrode 24a. Then, the gate insulation layer 28 is covered by a gate conductive layer (not shown). Another photolithography process and another etching process are performed with a third photomask in other to pattern the gate conductive layer, thereby forming a gate conductive pattern layer 30. At this stage, the vertical thin-film transistor structure 32 of this embodiment is accomplished. In this embodiment, because metal oxide tends to react with hydrogen and water vapor, the electrical properties of metal oxide may be affected. To prevent the step of forming the gate insulation layer 28 from damaging the electrical properties of the first channel layers 26, the material of forming the gate insulation layer 28 preferably includes oxide, such as silicon oxide, silicon nitride, alumina, titanium dioxide or silicon oxynitride. Moreover, the gate conductive pattern layer 30 includes a scan line 30a, which is disposed along the second direction 34 different from the first direction 23. The portion of the scan line 30a intersecting the data line 20a serves as a gate electrode 30b. The gate electrode 30b covers the first channel layers 26; on the other hand, the gate electrode 30b does not completely cover the drain electrode 24a and thus a first opening 30c is formed. The first opening 30c does not overlap the first channel layers 26 but is surrounded by the gate electrode 30b so as to prevent large parasitic capacitors between the gate electrode 30b and the drain electrode 24a of the vertical thin-film transistor structure 32. In this embodiment, the width of the first opening 30c in the first direction 23 is approximately wider than 2 micrometers (μm); the width of the first opening 30c in the second direction 34 is approximately wider than 2 μm. Moreover, the sidewall of the gate electrode 30b adjacent to the first opening 30c is preferably aligned to the sidewall of the upper portion 26a of each of the first channel layers 26 so as to reduce the parasitic capacitors between the gate electrode 30b and the drain electrode 24a of the vertical thin-film transistor structure 32.

FIG. 13 is a cross-sectional view diagram taken along a cross-sectional line A-A' in FIG. 12. FIG. 13 is a cross-sectional view diagram taken along a cross-sectional line C-C' in FIG. 12. As shown in FIGS. 12-14, a planarization layer 36 is formed to cover the scan line 30a and the gate insulation layer 28. Then, another photolithography process and another etching process are performed with a fourth photomask to form a second opening 36a in the planarization layer 36 and expose the drain electrode 24a through the second opening 36a. A deposition process is then carried out so that a conductive layer (not shown) is formed to cover the planarization layer 36. At the same time, the conductive layer contacts the drain electrode 24a through the second opening 36a. Another photolithography process and another etching process are performed with a fifth photomask so as to pattern the conductive layer, and therefore a pixel electrode 38 is formed. Accordingly, the pixel structure 40 of this embodiment is accomplished. In this embodiment, the pixel electrode 38 is formed of transparent conductive material, such as indium zinc oxide, indium tin oxide (ITO), aluminum zinc oxide (AZO) and aluminum tin oxide, but is not limited thereto. Therefore, the pixel electrode 38 can serve as the driving electrode of the liquid crystal layer of the display panel. The display panel of the embodiment is a liquid crystal display panel.

It is worth noting that, in the thin-film transistor structure of this embodiment, because the source electrode 20b and the drain electrode 24a are stacked together, and because the first channel layers 26, which serve as the channel of the vertical thin-film transistor structure 32, extend from the upper surface of the drain electrode 24a to the upper surface of the source electrode 20b along the direction perpendicular to the substrate 10, the resulting thin-film transistor structure is the vertical thin-film transistor structure 32. The ratio of the area of the first channel layers 26 to the area of the substrate 10 from the top view, therefore, can be effectively reduced owing to the vertical thin-film transistor structure design—that is to say, the volume of the vertical thin-film transistor structure 32 in this embodiment shrinks, and the ratio of the volume of the thin-film transistor structure to the volume of a pixel structure 40 decreases. Accordingly, the aperture ratio of the pixel structure 40 of the vertical thin-film transistor structure 32 in this embodiment rises effectively. Moreover, because of having the two first channel layers 26, the vertical thin-film transistor structure 32 of this embodiment ensures minimums of the channel width and the operating current, thereby preventing the channel from being too narrow.

The pixel structures and the vertical thin-film transistor structures of the display panel of the present invention and the fabrication methods thereof are not restricted to the preceding embodiments. Other embodiments or modifications will be detailed in the following description. In order to simplify and show the difference between the other embodiments or modifications and the above-mentioned embodiment, the same numerals denote the same components in the following description, and the same parts are not detailed redundantly.

Figure 15:
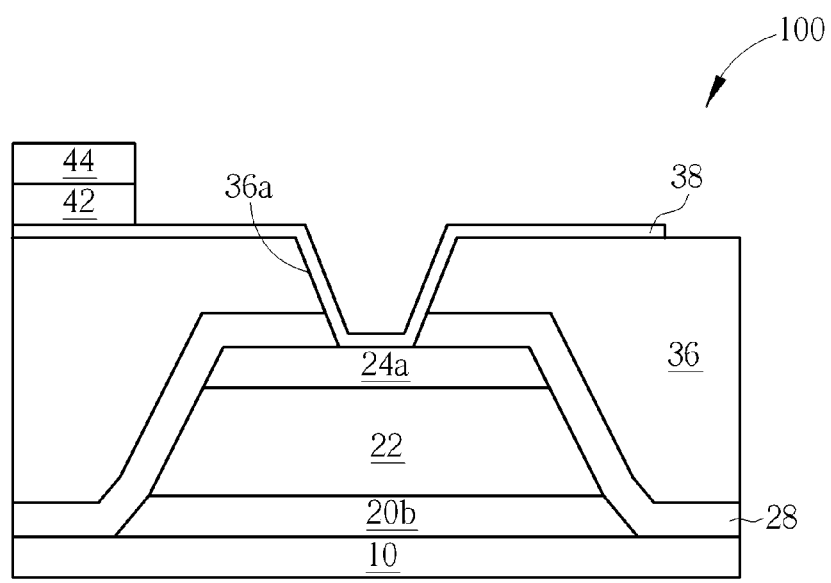
FIG. 15 is a schematic diagram illustrating a method for fabricating a pixel structure of a display panel according to a second embodiment of the present invention.

Please refer to FIG. 15. FIG. 15 is a schematic diagram illustrating a method for fabricating a pixel structure of a display panel according to a second embodiment of the present invention, and also the cross-sectional view schematic diagram illustrating the pixel structure of the display panel according to the second embodiment of the present invention. As shown in FIG. 15, compared with the preceding first embodiment, after the steps of forming the pixel electrode 38 in the method for fabricating the pixel structure 100 of the embodiment, an organic luminescent layer 42 and an upper electrode 44 are formed on the pixel electrode 38 in sequence. The organic luminescent layer 42 and the upper electrode 44 are stacked sequentially on the pixel electrode 38. Accordingly, the display panel of this embodiment is an active matrix organic light-emitting diode display panel. In this embodiment, the upper electrode 44 may be formed of opaque conductive materials, such as metal, but is not limited thereto. In this condition, preferably, the organic luminescent layer 42 does not overlap the vertical thin-film transistor structure 32 so that the organic luminescent layer 42 emits light from the bottom of the substrate 10, but is not limited thereto. In other words, light passes through the substrate 10. In another embodiment, the upper electrode 44 may be formed of transparent conductive materials so that the organic luminescent layer 42 may emit light from the upper electrode 44. Moreover, the pixel electrode 38 may be formed of opaque conductive materials.

Figure 16:
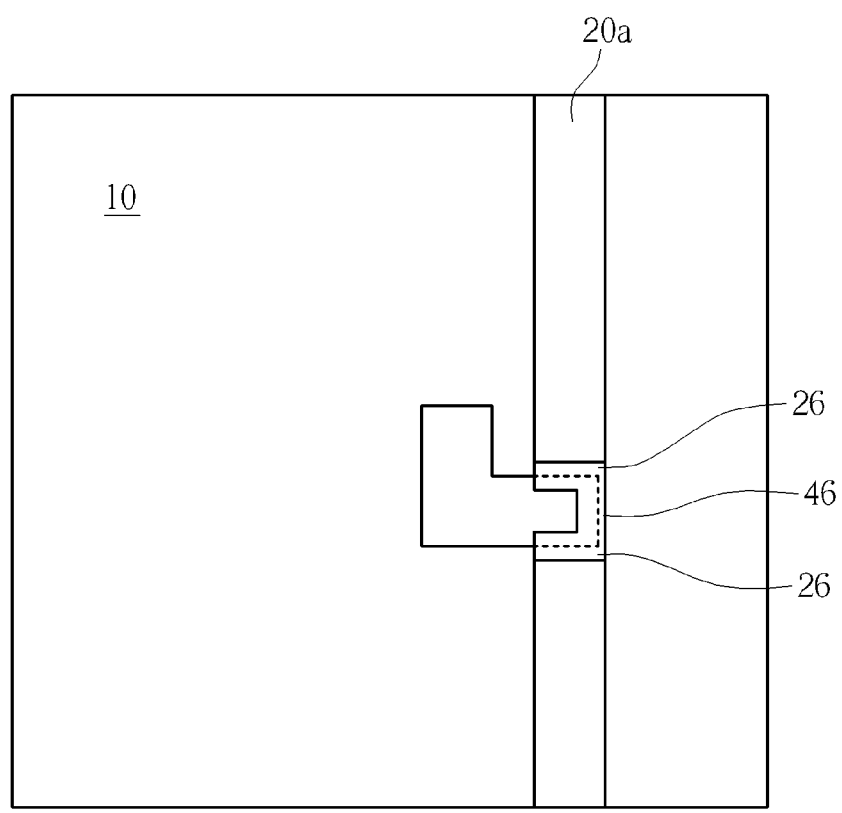
FIG. 16 is a schematic diagram illustrating a method for fabricating a vertical thin-film transistor structure of a display panel according to a third embodiment of the present invention.
Figure 17:
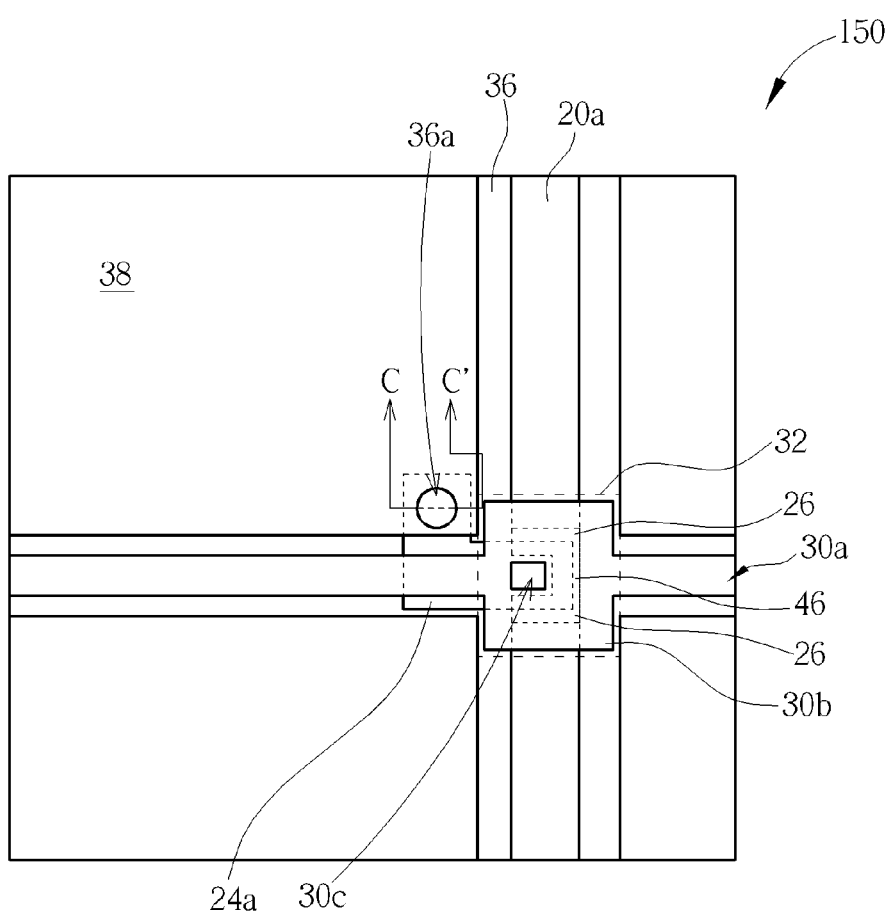
FIG. 17 is a top-view schematic diagram illustrating the vertical thin-film transistor structure of the display panel according to the third embodiment of the present invention.

Please refer to FIGS. 16-17. FIG. 16 is a schematic diagram illustrating a method for fabricating a vertical thin-film transistor structure of a display panel according to a third embodiment of the present invention. FIG. 17 is a top-view schematic diagram illustrating the vertical thin-film transistor structure of the display panel according to the third embodiment of the present invention. As shown in FIGS. 16-17, compared with the preceding first embodiment, the method for fabricating the vertical thin-film transistor structure 150 of the embodiment further includes forming a second channel layer 46 between the first channel layers 26 in the step of forming the first channel layers 26. Moreover, the first channel layers 26 and the second channel layer 46 are formed at the same time, and the second channel layer 46 and the first channel layers 26 constitute a U-shaped channel layer. More specifically speaking, the second channel layer 46 is disposed along the sidewall of the drain electrode 24a between the first channel layers 26. The second channel layer 46 extends from the upper surface of the drain electrode 24a along the sidewall of the drain electrode 24a, along the sidewall of the insulation layer 22 and to the upper surface of the source electrode 20b in sequence. The second channel layer 46 contacts the sides of the first channel layers 26. Compared to the vertical thin-film transistor structure of the preceding embodiments, because of the second channel layer 46, the channel width of the U-shaped channel layer in the vertical thin-film transistor structure 150 of this embodiment is wider than the channel width of the first channel layers 26, thereby increasing the operating current of the vertical thin-film transistor structure 150.

Figure 18:
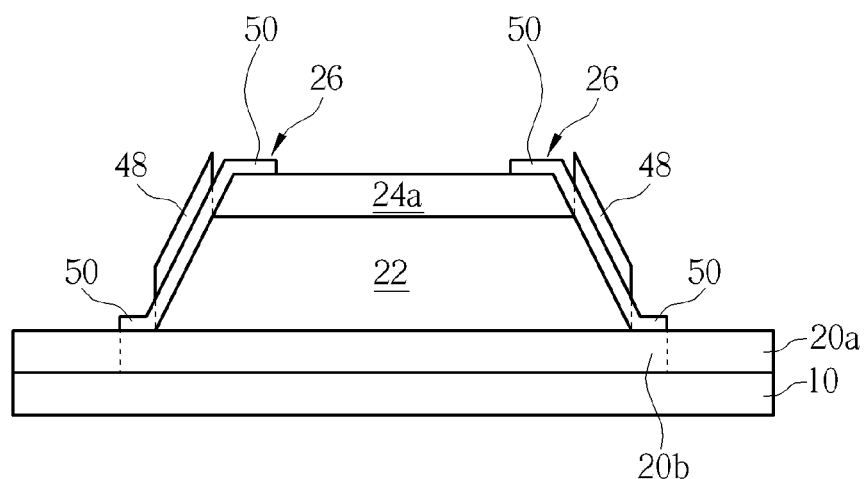
FIG. 18 is a schematic diagram illustrating a method for fabricating a vertical thin-film transistor structure according to a fourth embodiment of the present invention.
Figure 19:
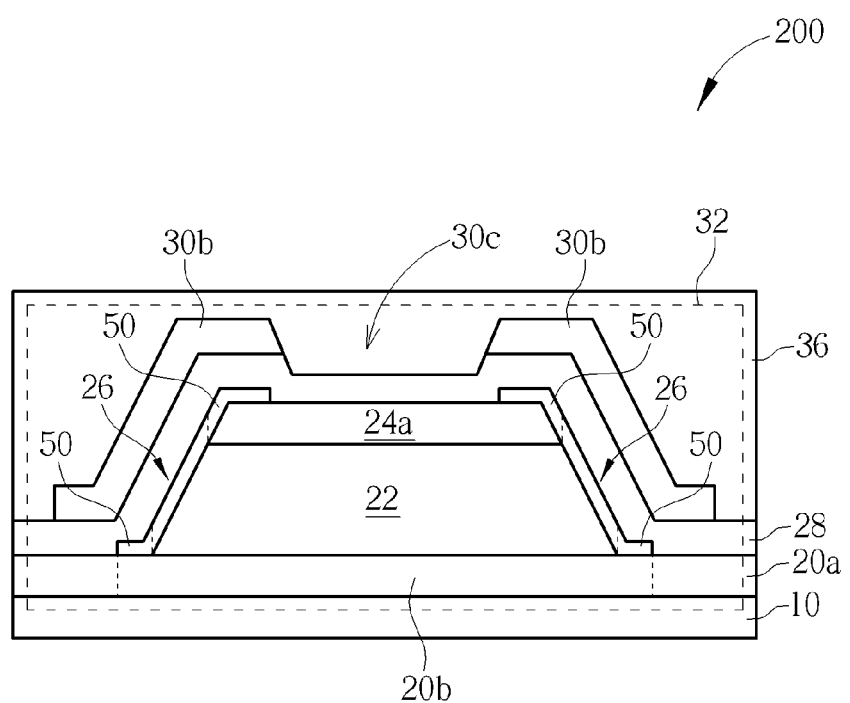
FIG. 19 is a cross-sectional view schematic diagram illustrating the vertical thin-film transistor structure according to the fourth embodiment of the present invention.

Please refer to FIGS. 18-19. FIG. 18 is a schematic diagram illustrating a method for fabricating a vertical thin-film transistor structure according to a fourth embodiment of the present invention. FIG. 19 is a cross-sectional view schematic diagram illustrating the vertical thin-film transistor structure according to the fourth embodiment of the present invention. As shown in FIGS. 18-19, compared with the preceding first embodiment, in the method for fabricating the vertical thin-film transistor structure 200 of the embodiment, the material of forming the first channel layers 26 includes polycrystalline silicon or amorphous silicon. Moreover, the method of forming the first channel layers 26 includes the following steps. Second photoresist patterns 48 are formed on the first channel layers 26 respectively—more specifically, each of the second photoresist patterns 48 is disposed on a portion of each of the first channel layer, and the portion of the first channel layer corresponds to the insulation layer 22. An ion implantation process is then carried out—conductive dopants are diffused into a portion of each of the first channel layers 26 contacting the source electrode 20b and a portion of each of the first channel layers 26 contacting the drain electrode 24a. A thermal drive-in process is then performed—two doped regions 50 are formed in the portion of each of the first channel layers 26 contacting the source electrode 20b and in the portion of each of the first channel layers 26 contacting the drain electrode 24a. The second photoresist pattern 48 is removed. In other words, there is one doped region 50 in the portion of each of the first channel layers 26 contacting the source electrode 20b; there is one doped region 50 in the portion of each of the first channel layers 26 contacting the drain electrode 24a. Therefore, the doped region 50 can serve as contact doped regions 50 to reduce the contact resistance between the source electrode 20b and each of the first channel layers 26 and the contact resistance between the drain electrode 24a and each of the first channel layers 26. Moreover, the conductive type of the doped region 50 of the embodiment may depend on the design of the vertical thin-film transistor structure 200 for practical uses.

In other embodiments of the present invention, a method for fabricating the pixel structure of a display panel and a method for fabricating a thin film transistor structure of a display panel can also be the combination of at least two of the preceding embodiments. Besides, the pixel structure of the display panel and the thin film transistor structure of the display panel can also be the combination of at least two of the preceding embodiments.

To sum up, in the thin-film transistor structure of the present invention, because the source electrode and the drain electrode are stacked together, and because the first channel layers extend from the upper surface of the drain electrode to the upper surface of the source electrode along the direction perpendicular to the substrate, the ratio of the area of the first channel layers to the area of the substrate from the top view can be effectively reduced. Therefore, the volume of the conventional thin-film transistor structure shrinks, and the ratio of the volume of the conventional thin-film transistor structure to the volume of a pixel structure decreases. Accordingly, the aperture ratio of the pixel structure rises effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical thin-film transistor structure of a display panel, comprising:
   a substrate;
   a source electrode disposed on the substrate;
   an insulation layer disposed on the source electrode;
   a drain electrode disposed on the insulation layer;
   two first channel layers respectively disposed at two opposite ends of the drain electrode, wherein the first channel layers extend from an upper surface of the drain electrode, along two opposite sidewalls of the drain electrode, along two opposite sidewalls of the insulation layer and to an upper surface of the source electrode in sequence respectively, and each of the first channel layers contacts the source electrode and the drain electrode;
   a gate insulation layer disposed on the source electrode, the first channel layers and the drain electrode; and
   a gate electrode disposed on the gate insulation layer, wherein the gate electrode covers the first channel layers.

2. The vertical thin-film transistor structure of the display panel according to claim 1, further comprising a second channel layer disposed between the first channel layers, so that the second channel layer and the first channel layers constitute a U-shaped channel layer.

3. The vertical thin-film transistor structure of the display panel according to claim 1, wherein each of the first channel layers has a lower portion and an upper portion, the upper portion contacts the upper surface of the drain electrode, and the lower portion contacts the upper surface of the source electrode.

4. The vertical thin-film transistor structure of the display panel according to claim 1, wherein each of the first channel layers comprises a metal oxide.

5. The vertical thin-film transistor structure of the display panel according to claim 4, wherein the metal oxide is indium gallium zinc oxide (IGZO).

6. The vertical thin-film transistor structure of the display panel according to claim 1, wherein each of the first channel layers comprises polycrystalline silicon or amorphous silicon.

7. The vertical thin-film transistor structure of the display panel according to claim 6, wherein a portion of each of the first channel layers contacting the source electrode has a doped region, and another portion of each of the first channel layers contacting the drain electrode has another doped region.

8. The vertical thin-film transistor structure of the display panel according to claim 1, wherein the display panel is an active matrix organic light-emitting diode display panel.

9. The vertical thin-film transistor structure of the display panel according to claim 1, wherein the display panel is a liquid crystal display panel.

10. A method for fabricating a vertical thin-film transistor structure of a display panel, comprising:
    providing a substrate;
    forming a source electrode, an insulation layer and a drain electrode on the substrate, wherein the source electrode, the insulation layer and the drain electrode are stacked sequentially on the substrate;
    forming two first channel layers respectively at two opposite ends of the drain electrode, wherein the first channel layers extend from an upper surface of the drain electrode, along two opposite sidewalls of the drain electrode, along two opposite sidewalls of the insulating layer and to an upper surface of the source electrode in sequence respectively, and each of the first channel layers contacts the source electrode and the drain electrode;

forming a gate insulation layer covering the source electrode, the first channel layers and the drain electrode; and forming a gate electrode on the gate insulation layer, wherein the gate electrode covers the first channel layers.

11. The method for fabricating the vertical thin-film transistor structure of the display panel according to claim 10, wherein the steps of forming the source electrode, the insulation layer and the drain electrode comprise:

forming a first metal layer, an insulation material layer and a second metal layer on the substrate;

forming a photoresist pattern on the second metal layer with a halftone photomask, wherein the photoresist pattern exposes a portion of the second metal layer, the photoresist pattern has a first thickness portion and a second thickness portion, a thickness of the first thickness portion is thinner than a thickness of the second thickness portion;

removing the portion of the second metal layer exposed by the photoresist pattern, a portion of the insulation material layer under the portion of the second metal layer exposed by the photoresist pattern, and a portion of the first metal layer under the portion of the second metal layer exposed by the photoresist pattern so as to form the source electrode;

removing the first thickness portion of the photoresist pattern, the second metal layer under the first thickness portion, and the insulation material layer under the first thickness portion so as to form the insulation layer and the drain electrode; and removing the second thickness portion of the photoresist pattern.

12. The method for fabricating the vertical thin-film transistor structure of the display panel according to claim 10, wherein the step of forming the first channel layers comprises forming a second channel layer disposed between the first channel layers, and the second channel layer and the first channel layers constitute a U-shaped channel layer.

13. The method for fabricating the vertical thin-film transistor structure of the display panel according to claim 10, wherein a material of forming the first channel layers comprises a metal oxide.

14. The method for fabricating the vertical thin-film transistor structure of the display panel according to claim 13, wherein the metal oxide is indium gallium zinc oxide (IGZO).

15. The method for fabricating the vertical thin-film transistor structure of the display panel according to claim 10, wherein a material of forming the first channel layers comprises polycrystalline silicon or amorphous silicon.

16. The method for fabricating the vertical thin-film transistor structure of the display panel according to claim 15, wherein the step of forming the first channel layers comprises forming two doped regions in a portion of each of the first channel layers contacting the source electrode and in a portion of each of the first channel layers contacting the drain electrode.

* * * * *